(12) United States Patent
Mizue

(10) Patent No.: US 9,803,278 B2
(45) Date of Patent: Oct. 31, 2017

(54) VAPOR PHASE GROWTH METHOD

(71) Applicant: SUMITOMO ELECTRIC INDUSTRIES, LTD., Osaka-shi, Osaka (JP)

(72) Inventor: Chihoko Mizue, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/317,042

(22) Filed: Jun. 27, 2014

(65) Prior Publication Data

US 2015/0004319 A1 Jan. 1, 2015

(30) Foreign Application Priority Data

Jun. 28, 2013 (JP) ................................ P2013-137142

(51) Int. Cl.
  C23C 16/00 (2006.01)
  C23C 16/40 (2006.01)
  C23C 16/455 (2006.01)
(52) U.S. Cl.
  CPC ...... *C23C 16/403* (2013.01); *C23C 16/45523* (2013.01)
(58) Field of Classification Search
  CPC ....... C23C 16/403; C23C 16/40; C23C 16/44; C23C 16/455; C23C 16/45523
  USPC .............................................. 427/248.1, 250
  See application file for complete search history.

(56) References Cited

U.S. PATENT DOCUMENTS

| 7,981,473 | B2* | 7/2011 | Kim et al. | 427/255.28 |
|---|---|---|---|---|
| 2002/0106451 | A1* | 8/2002 | Skarp | C23C 16/403 427/248.1 |
| 2004/0092132 | A1* | 5/2004 | Doan et al. | 438/785 |
| 2005/0271813 | A1* | 12/2005 | Kher et al. | 427/248.1 |
| 2007/0141258 | A1* | 6/2007 | Fareed | C23C 16/303 427/255.394 |

(Continued)

FOREIGN PATENT DOCUMENTS

| JP | H6-226084 | 8/1994 |
|---|---|---|
| JP | 2002-161353 | 6/2002 |

(Continued)

OTHER PUBLICATIONS

Matero et al. Effect of water dose on the atomic layer deposition rate of oxide thin films, Thin Solid Films, 368 (2000) pp. 1-7.*

(Continued)

*Primary Examiner* — Kelly M Gambetta
(74) *Attorney, Agent, or Firm* — Smith, Gambrell & Russell, LLP.

(57) ABSTRACT

A vapor phase growth method is disclosed. The method includes a step of preparing a substrate in a chamber, a first step of absorbing only a first element to the substrate by supplying a first source material into the chamber, a second step of suspending supply of the first source material into the chamber, a third step of absorbing a second element to the substrate by supplying a second source material into the chamber, wherein the supply of the second source material is started while the first source material remains in an atmosphere of the chamber, a fourth step of suspending supply of the second source material into the chamber, and a fifth step of repeating from the first step to the fourth step.

15 Claims, 9 Drawing Sheets

(56) References Cited

U.S. PATENT DOCUMENTS

2010/0167555 A1* 7/2010 Maula et al. ............ 438/785

FOREIGN PATENT DOCUMENTS

| JP | 2004-103689 | 4/2004 |
| --- | --- | --- |
| JP | 2004-193280 | 7/2004 |
| JP | 2005-229129 | 8/2005 |
| JP | 2006-080474 | 3/2006 |
| JP | 2006-516304 | 6/2006 |
| JP | 2006-524434 | 10/2006 |
| JP | 2007-005545 | 1/2007 |
| JP | 2010-098141 | 4/2010 |
| JP | 2010-177242 | 8/2010 |

OTHER PUBLICATIONS

Japanese Office Action dated Mar. 7, 2017 for priority Japanese Aplication No.: 2013-137142

* cited by examiner

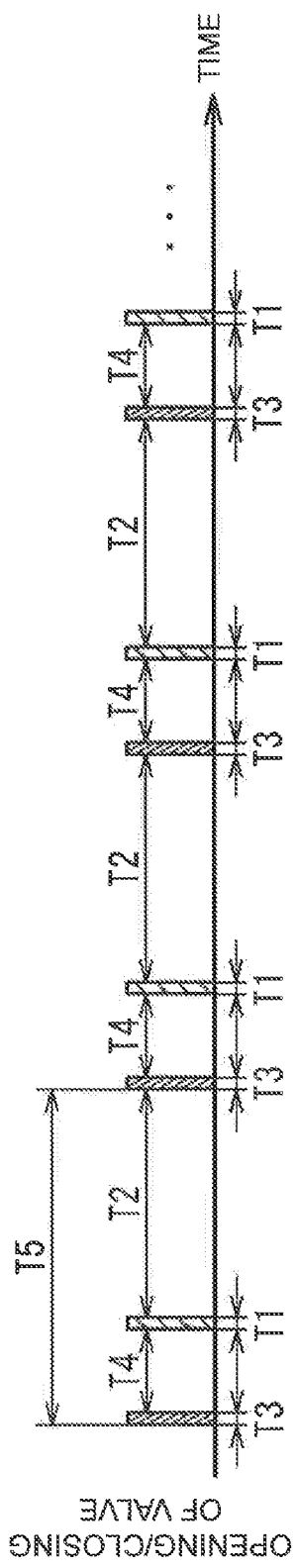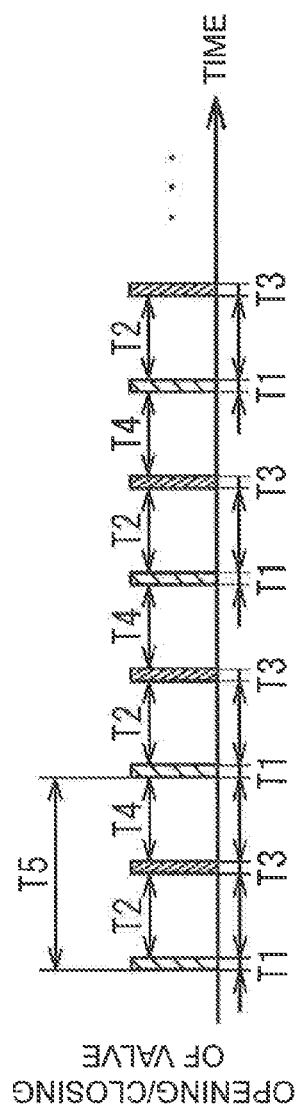

VAPOR PHASE GROWTH METHOD

FIELD

The present invention relates to a vapor phase growth method.

BACKGROUND

The ALD (Atomic Layer Deposition) process is known as a vapor phase growth method. Japanese Patent Application Laid-Open Publication No. 2010-98141 describes that the ALD process is used to deposit an aluminum oxide ($Al_2O_3$) film from materials of TMA (Tri-Methyl-Aluminum, trimethylaluminum) and water ($H_2O$). The ALD process is a method of alternately supplying source gases to deposit monoatomic layers of an insulator layer by layer.

SUMMARY

A high-quality insulator in a composition close to a stoichiometric composition can be formed by using the ALD process. In the deposition method with an ALD system, however, a deposition rate is likely to be low because the atomic layers are deposited layer by layer.

An aspect of the present invention is a vapor phase growth method comprising: a step of introducing a substrate into a chamber; a first step of adsorbing only a first element to the substrate by supplying a first source material into the chamber; a second step of stopping (suspending) supply of the first source material into the chamber; a third step of adsorbing a second element to the substrate by supplying a second source material into the chamber, wherein the supply of the second source material is started while the first source material remains in an atmosphere of the chamber; a fourth step of stopping (suspending) supply of the second source material into the chamber; and a fifth step of repeating from the first step to the fourth step.

BRIEF DESCRIPTION OF THE DRAWINGS

FIG. 9A and FIG. 9B are timing charts showing other timing examples of supply and evacuation of materials in Example 1.

DETAILED DESCRIPTION

Description of Embodiments

Figure 1:
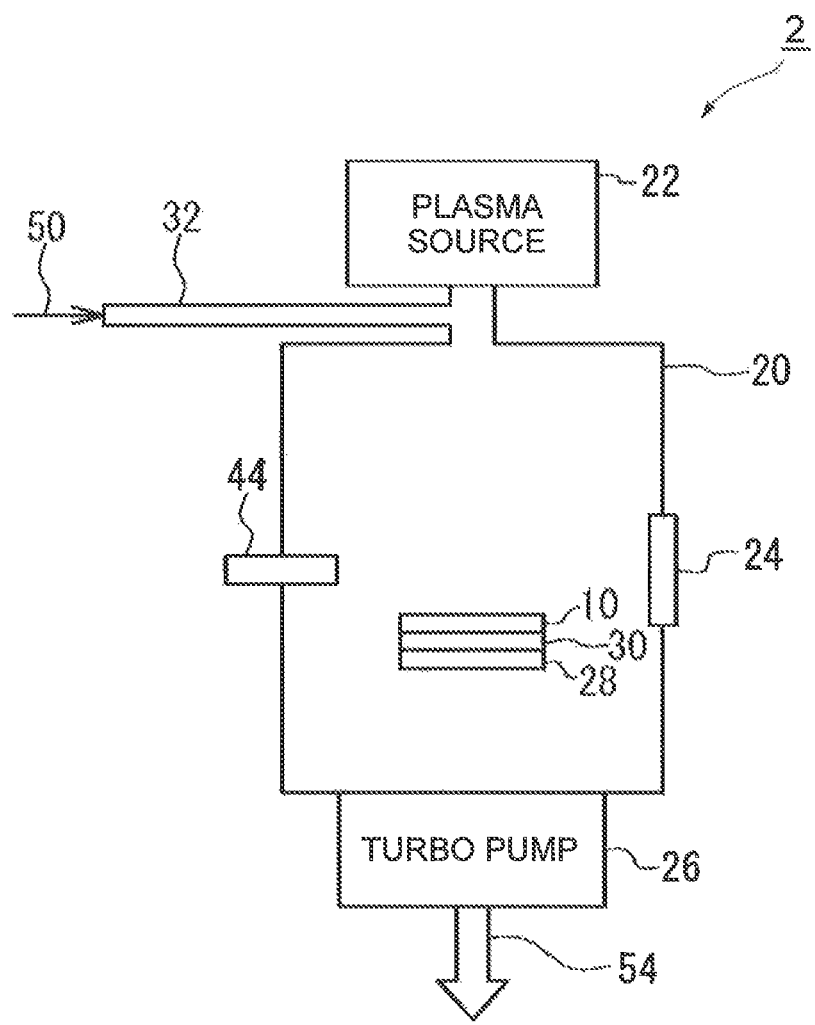
FIG. 1 is a schematic diagram showing an ALD system.

First of all, embodiments of the invention of the subject application will be described one by one.

An embodiment related to the present invention is a vapor phase growth method comprising: a step of introducing a substrate into a chamber; a first step of adsorbing only a first element to the substrate by supplying a first source material into the chamber; a second step of stopping (suspending) supply of the first source material into the chamber; a third step of adsorbing a second element to the substrate by supplying a second source material into the chamber, wherein the supply of the second source material is started while the first source material remains in an atmosphere of the chamber; a fourth step of stopping (suspending) supply of the second source material into the chamber; and a fifth step of repeating from the first step to the fourth step.

The foregoing method may be implemented in a method wherein the second step includes duration of stopping of supply both of the first and second source material into the chamber.

The foregoing method may be implemented in a method wherein the duration is not more than two seconds.

The foregoing method may be implemented in a method wherein the duration is not more than 1.5 seconds.

The foregoing method may be implemented in a method wherein the duration is not more than one second.

The foregoing method may be implemented in a method wherein supply of the first source material into the chamber in the fifth step is started while the second source material remains in an atmosphere of the chamber.

The foregoing method may be implemented in a method wherein the first source material is an organometallic material and the second source material is an oxidizing material.

The foregoing method may be implemented in a method wherein the organometallic material is trimethylaluminum or triethylaluminum, and the oxidizing material is water, oxygen, or ozone.

The foregoing method may be implemented in a method wherein a film deposited on the substrate is a layer having a single composition in the thickness direction thereof.

The foregoing method may be implemented in a method wherein a pressure in the chamber at a start of the third step is not less than 0.3 Torr.

The foregoing method may be implemented in a method wherein a deposition rate of a film on the substrate is not less than 0.12 nm/cycle.

The foregoing method may be implemented in a method wherein duration of the fourth step is longer than that of the second step.

The foregoing method may be implemented in a method wherein a film formed on the substrate is aluminum oxide having a refractive index between 1.55 to 1.63.

Details of Embodiments

Specific examples of the vapor phase growth method according to embodiments of the present invention will be described below drawings. It should be noted that the present invention is not limited to these examples but shown in the claims, and it is intended that all modifications that come within the meaning and range of equivalence to the claims should be embraced herein. In the description, the same elements or elements having they same function are denoted with the same reference signs, and an overlapping description will be omitted.

First, the ALD process which is one of the vapor phase growth methods will be described. FIG. 1 is a schematic diagram showing an ALD system. As shown in FIG. 1, the ALD system 2 mainly has a main chamber 20, a plasma source 22, an inlet 24, a turbo pump 26, and a material feed tube 32. A heater 28 and a stage 30 are arranged in the main chamber 20. The stage 30 supports a substrate 10. The heater 28 heats the substrate 10 up to a desired temperature. The inside of the main chamber 20 is evacuated by the turbo pump 26. The turbo pump 26 is further evacuated as indicated by an arrow 54. The pressure (degree of vacuum) in the main chamber 20 is measured by a vacuum gauge 44.

The inlet 24 is connected to a load lock chamber. The substrate 10 is introduced through the inlet 24. The material feed tube 32 is a tube for guiding materials 50 such as an oxidizing material and an organometallic material into the main chamber 20. The material feed tube 32 is provided with a valve for oxidizing material and a valve for organometallic material. Supply and stop of the oxidizing material into the main chamber 20 can be controlled by opening/closing of the oxidizing material valve. Supply and stop of the organometallic material into the main chamber 20 can be controlled by opening/closing of the organometallic material valve. The plasma source 22 generates a plasma in the main chamber 20. The system may be configured without the plasma source 22.

Figure 2:
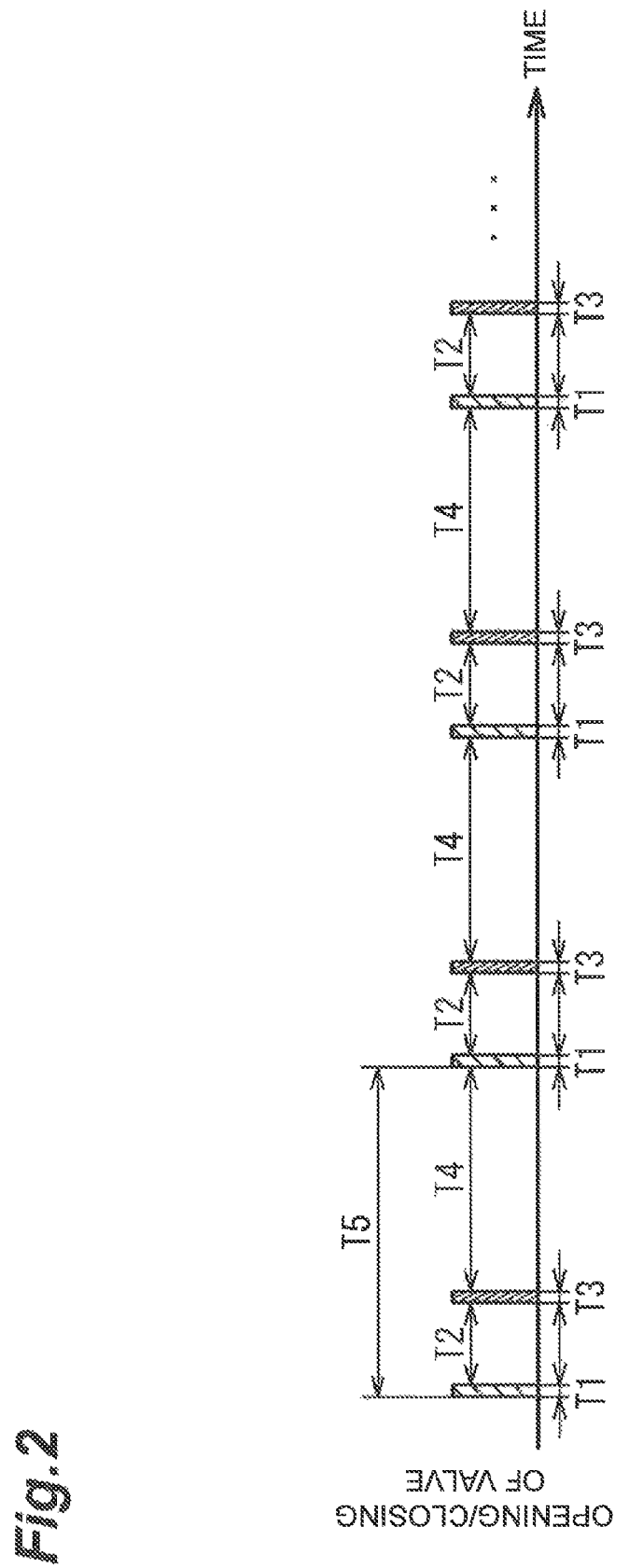
FIG. 2 is a timing chart showing timings of supply and evacuation of materials.

FIG. 2 is a timing chart showing timings of supply and evacuation of materials. As shown in FIG. 2, during each period T1, the oxidizing material valve is opened while the organometallic material valve is closed. This operation causes the oxidizing material to be supplied into the main chamber 20. During each period T2, the oxidizing material valve and the organometallic material valve both are closed. This operation stops (suspends) the supply of the oxidizing material and the organometallic material into the main chamber 20 and evacuates the oxidizing material. During each period T3, the organometallic material valve is opened while the oxidizing material valve is closed. This operation causes the organometallic material to be supplied into the main chamber 20. During each period T4, the organometallic material valve is closed. This operation stops (suspends) the supply of the oxidizing material and the organometallic material into the main chamber 20 and evacuates the organometallic material during the period T4. Each period T5 from the period T1 to the period T4 is one cycle.

When an insulator is formed by the ALD process, e.g., when an insulating film used in a semiconductor device is formed herein, the period T3 is generally determined to be a period of time enough to deposit a single layer of metal atoms (or to form a monoatomic metal layer) on the surface of the substrate 10 by decomposition of the organometallic material. The period T4 is determined to be a period of time enough to sufficiently evacuate the organometallic material in the main chamber 20. The period T1 is determined to be a period of time enough to oxidize the surface of the monoatomic metal layer on the surface of the substrate 10. The period T2 is determined to be a period of time enough to sufficiently evacuate the oxidizing material in the main chamber 20. The insulating film can be deposited on the substrate 10 by successively repeating the supply of the organometallic material, the evacuation of the organometallic material, the supply of the oxidizing material, and the evacuation of the oxidizing material as described above. The insulating film of aluminum oxide or the like, which is hard to deposit by the CVD (Chemical Vapor Deposition) process, can be deposited by using the ALD process. That is, the insulating film with high quality can be obtained. The insulator (including the insulating film), after the deposition by the ALD process, is formed as an amorphous (non-crystalline) film.

The above process, however, requires the time to sufficiently evacuate the oxidizing material and the organometallic material in the periods T2 and T4. Therefore, the deposition rate of the insulating film is likely to low. The below will describe examples for increasing the deposition rate of the insulating film.

Examples

Figure 3A:
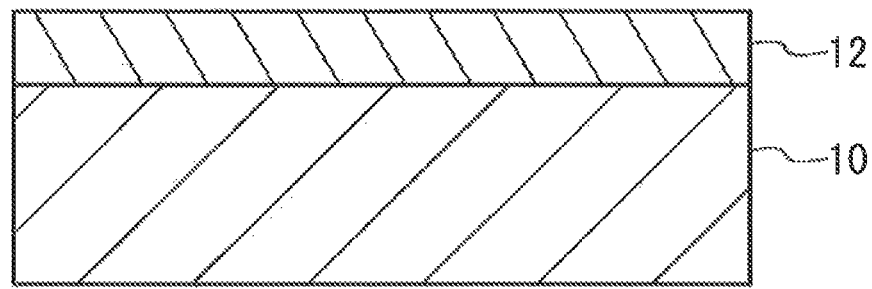
FIG. 3A and FIG. 3B are cross-sectional views showing Comparative Example 1 and Example 1.
Figure 3B:
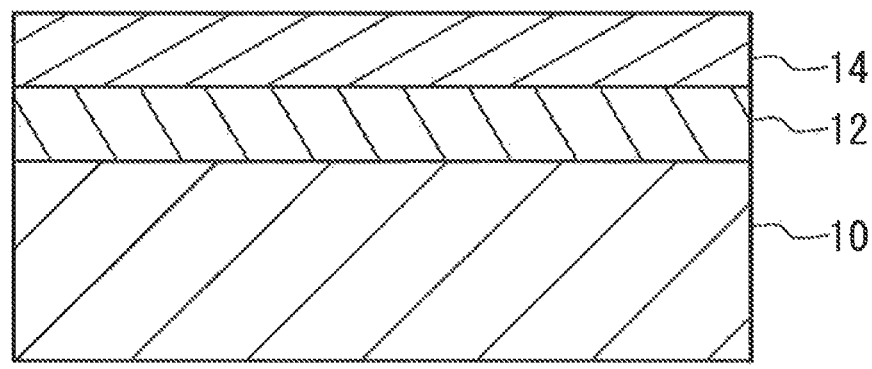

In Comparative Example 1 and Example 1, an aluminum oxide ($Al_2O_3$) film was formed in the film thickness of 40 nm on the substrate. FIG. 3A and FIG. 3B are cross-sectional views showing Comparative Example 1 and Example 1. As shown in FIG. 3A, the substrate 10 with a semiconductor layer 12 on a top face thereof was prepared. As shown in FIG. 3B, an insulating film 14 was deposited on the semiconductor layer 12.

The deposition conditions in Comparative Example 1, Example 1, and Modification of Example 1 are provided below.

Figure 4:
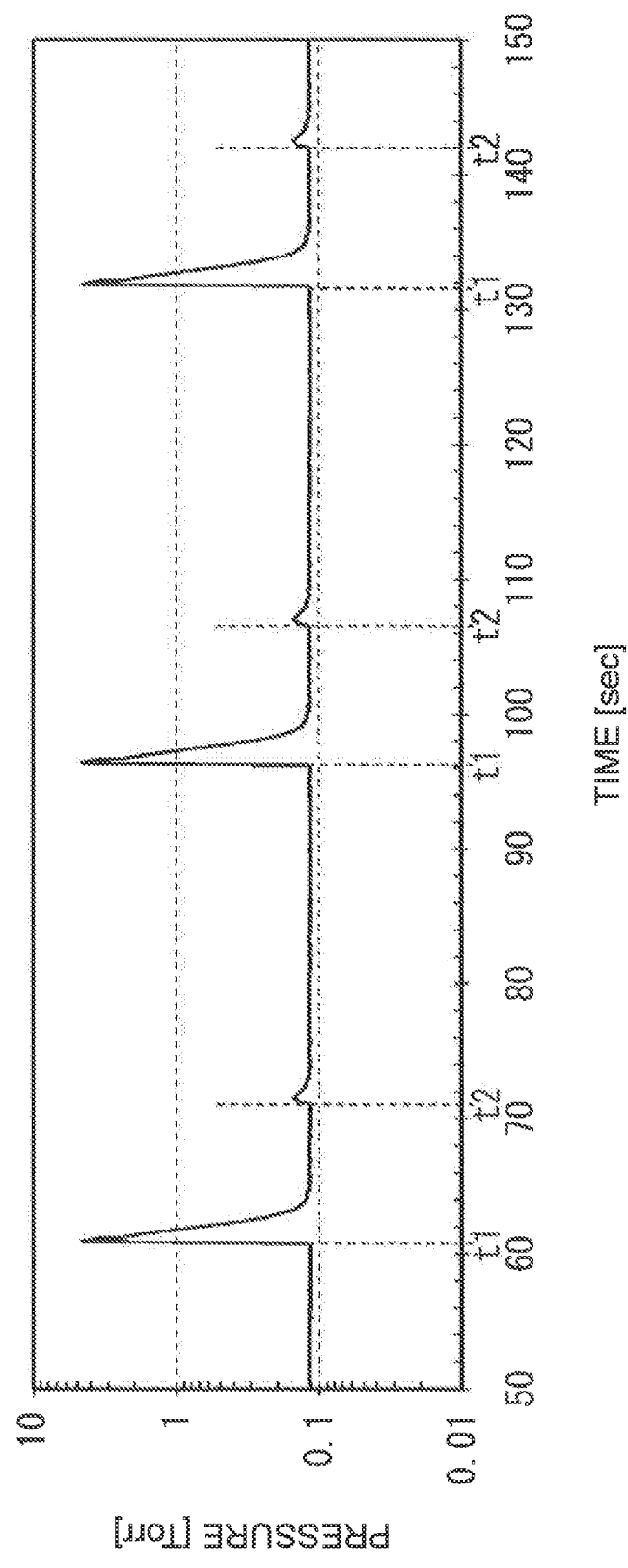
FIG. 4 is a drawing showing the pressure in a main chamber with respect to time in Comparative Example 1.

Oxidizing material: $O_3$ gas (ozone gas)
Organometallic material: TMA
Insulating film 14: 40 nm-thick aluminum oxide film
Period T1: 60 msec
Period T2: 10 sec (Comparative Example 1), 1 sec (Example 1), 2 sec (Modification)
Period T3: 60 msec.
Period T4: 25 sec (Comparative Example 1), 10 sec (Example 1)
Substrate temperature: 200° C.
Plasma source: not used FIG. 4 is a drawing showing the pressure in the main chamber with respect to time in Comparative Example 1. As shown in FIG. 4, each time t1 defines a start point of the period T1. The time t1 indicates a point of time when the oxidizing material valve is opened to introduce the $O_3$ gas into the main chamber 20. Each time t2 defines a start point of the period T3. The time t2 indicates a point of time when the organometallic material valve is opened to introduce TMA into the main chamber 20. In these examples, the background pressure was about 0.1 Torr. At the time t1, the pressure rose to about 5 Torr. Thereafter, the pressure returned to the background in about two seconds. At the time t2, the pressure rose to about 0.5 Torr. Thereafter, the pressure returned to the background in about two seconds.

Figure 5:
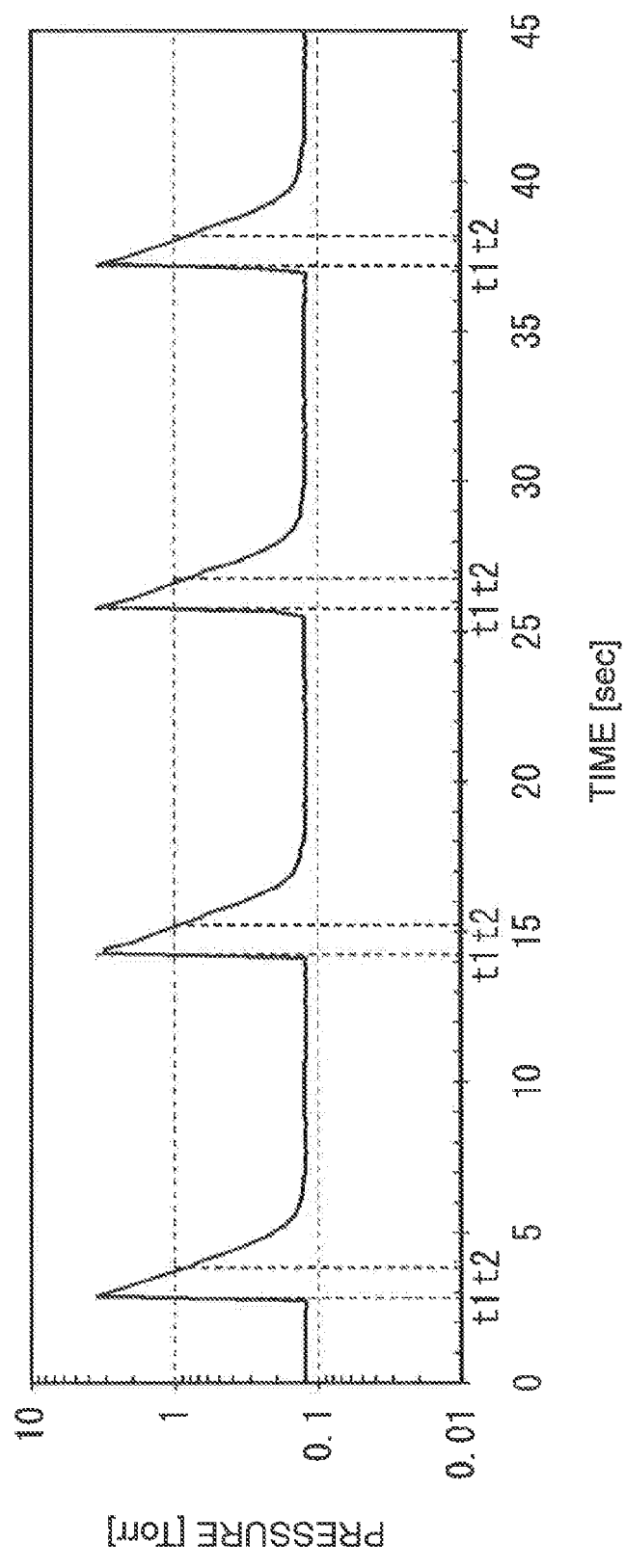
FIG. 5 is a drawing showing the pressure in the main chamber with respect to time in Example 1.

FIG. 5 is a drawing showing the pressure in the main chamber with respect to time in Example 1. As shown in FIG. 5, at the time t1 the oxidizing material valve was opened to increase the pressure to about 4 Torr. Thereafter, the time t2 was set to open the organometallic material valve before the pressure reached the background. Thereafter, the pressure returned to the background in about two seconds. In this manner, TMA was supplied in the middle of the evacuation of $O_3$ gas in Example 1.

The Inventor measured the deposition rates and refractive indices of deposited aluminum oxide films in Comparative Example 1, Example 1, and Modification. The Inventor also measured hydrogen, carbon, and fluorine concentrations in the deposited aluminum oxide films in Comparative Example 1 and Example 1 by the SIMS (Secondary Ion Mass Spectrometry) method. The period T4 in Comparative Example 1 is different from that in each of Example 1 and Modification. However, TMA was sufficiently evacuated in the period T4 in each of Comparative Example 1 and Example 1, as seen in FIGS. 4 and 5. Therefore, Comparative Example 1 can be compared with Example 1 and Modification.

Figure 6:
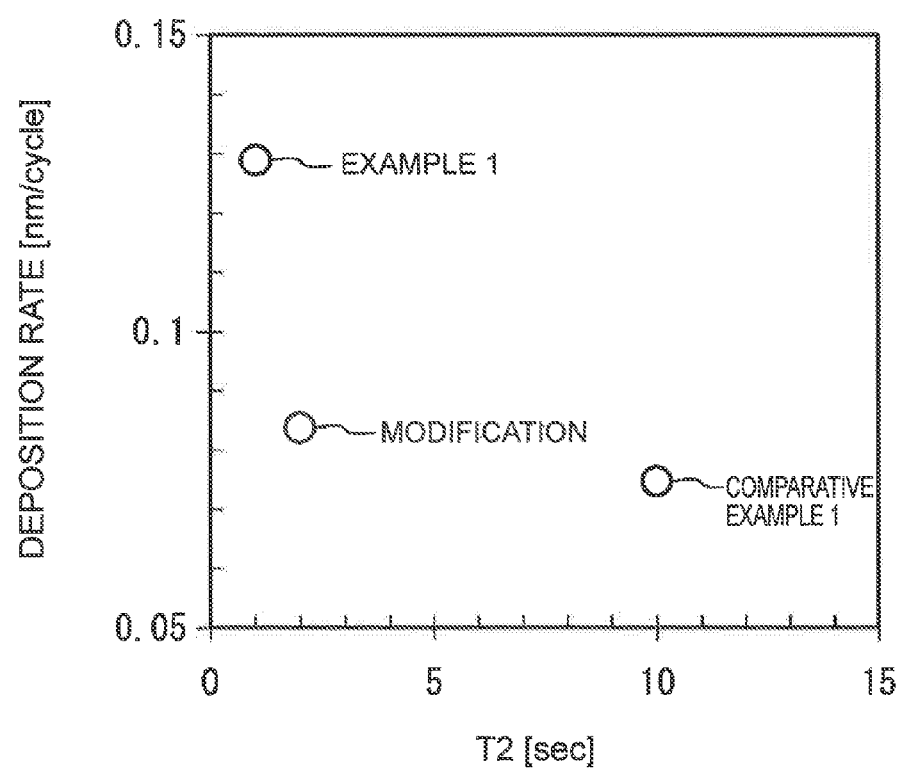
FIG. 6 is a drawing showing the deposition rate against period T2.

FIG. 6 is a drawing showing the deposition rate against period 12. As shown in FIG. 6, the deposition rate in Comparative Example 1 was approximately 0.075 nm/cycle. The deposition rate in Modification was approximately 0.08 nm/cycle. The deposition rate in Example 1 was approximately 0.13 nm/cycle. The deposition rate was improved by setting the period T2 to not more than two seconds.

Figure 7:
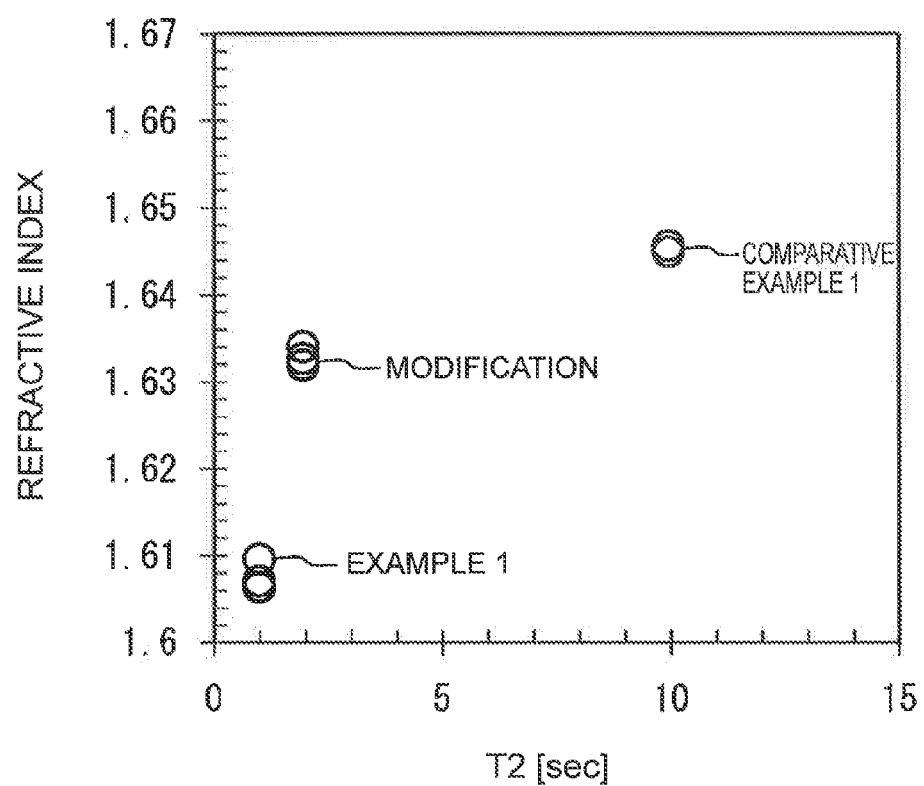
FIG. 7 is a drawing showing the refractive index of insulating film with respect to period T2.

FIG. 7 is a drawing showing the refractive index of insulating film against period 12. As shown in FIG. 7, the refractive index of the insulating film 14 was approximately 1.65 in Comparative Example 1. The refractive index of the insulating film 14 was approximately the same value as the refractive index of aluminum oxide in the stoichiometric composition. In Modification, the refractive index of the insulating film 14 was approximately 1.63. In Example 1, the refractive index of the insulating film 14 was approximately 1.61. As described above, when Example 1 was compared with Comparative Example 1, the refractive index of the insulating film 14 decreased slightly but not significantly. This result shows that the composition of the insulating film 14 in Example 1 and Modification is nearly the stoichiometric composition, and the film quality of the insulating film 14 in Example 1 and Modification underwent little degradation in comparison to Comparative Example 1.

Figure 8:
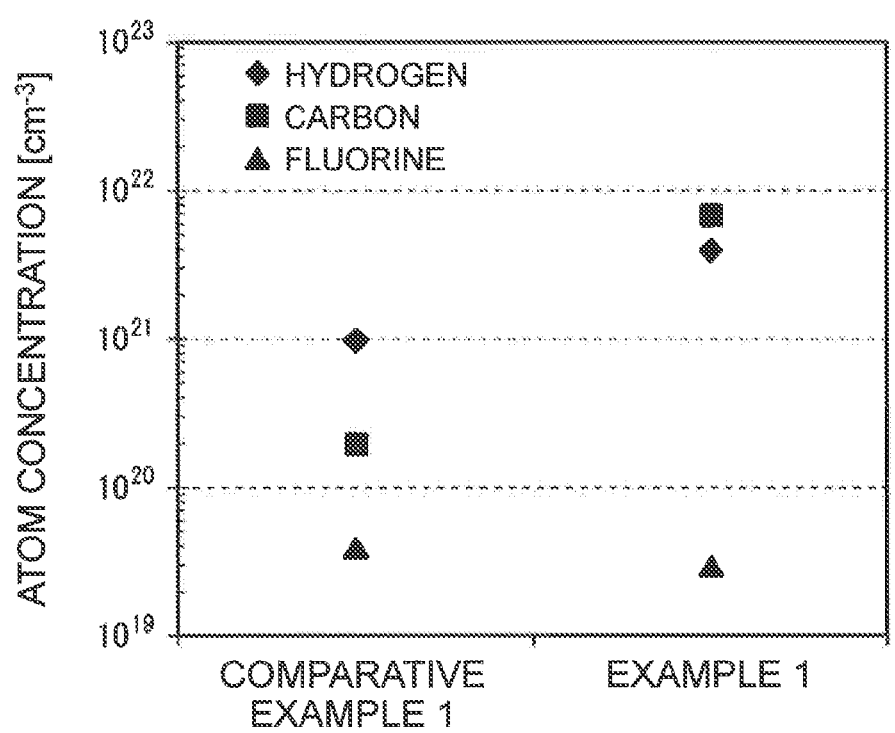
FIG. 8 is a drawing showing hydrogen, carbon, and fluorine concentrations.

FIG. 8 is a drawing showing hydrogen, carbon, and fluorine concentrations. As shown in FIG. 8, the hydrogen, carbon, and fluorine concentrations in the aluminum oxide film were about $1 \times 10^{21}$ cm$^{-3}$, about $2 \times 10^{20}$ cm$^{-3}$, and about $4 \times 10^{19}$ cm$^{-3}$, respectively, in Comparative Example 1. In Example 1, the hydrogen, carbon, and fluorine concentrations in the aluminum oxide film were about $4 \times 10^{21}$ cm$^{3}$, about $7 \times 10^{21}$ cm$^{3}$, and about $3 \times 10^{19}$ cm$^{-3}$, respectively. The hydrogen concentration and carbon concentration in Example 1 increased slightly but not significantly when compared with Comparative Example 1. The fluorine concentration in Example 1 showed little change from that in Comparative Example 1. This means that the impurity concentrations in the insulating film 14 in Example 1 were little different from those in Comparative Example 1.

The above results confirm that Example 1 and Modification can increase the deposition rate of the insulating film 14 while suppressing degradation of the film quality of the insulating film 14. The reason for it can be assumed as follows. With supply of TMA onto the substrate 10, a single layer of Al is formed on the surface of the substrate 10. Thereafter, $O_3$ gas is supplied onto the surface of the substrate 10. This gas supply results in oxidizing Al and forming a single layer of aluminum oxide. When TMA is supplied onto the surface of the substrate 10 in the middle of evacuation of $O_3$ gas, a single layer of Al is formed on the aluminum oxide film and, in addition thereto, $O_3$ gas and TMA are mixed over the substrate 10. This mixing results in forming aluminum oxide over the substrate 10 and forming multilayered aluminum oxide on the surface of the substrate 10. As just described, in one cycle, a monoatomic layer of aluminum oxide is deposited and, in addition thereto, aluminum oxide is deposited by reaction of $O_3$ gas and TMA in the main chamber 20 to deposit aluminum oxide. It is assumed that the foregoing process can increase the deposition rate while suppressing the degradation of film quality. On this occasion, the film quality of the insulating film 14 in Example 1 is slightly degraded and the composition of the insulating film 14 slightly deviates from the stoichiometric composition; for this reason, the refractive index thereof slightly decreases. Furthermore, slightly larger amounts of hydrogen and carbon are introduced into the insulating film 14.

According to the assumption as described above, Example 1 and Modification thereof are also applicable to the source materials other than $O_3$ gas and TMA. The oxidizing material applicable herein can be, for example, $O_2$ gas or $H_2O$. The organometallic material applicable herein can be, for example, TEA (Tri Ethyl Aluminum, triethylaluminum). When $O_2$ gas is used, the plasma source 22 may be provided in the main chamber 20, in order to enhance reactivity of $O_2$ gas. Plasmatised $O_2$ gas may be referred to as oxygen plasma.

The insulating film 14 is also applicable herein to silicon oxide ($SiO_2$), hafnium oxide ($HfO_2$), zirconium oxide (ZrO), gallium oxide ($Ga_2O_3$), magnesium oxide (MgO), titanium oxide ($TiO_2$), tantalum oxide ($Ta_2O_5$), or zinc oxide (ZnO).

For deposition of silicon oxide, the oxygen plasma can be used as the oxidizing material and 3DMAS ($SiH[N(CH_3)_2]_3$) or $SiCl_4$ as the organometallic material. For deposition of hafnium oxide, $H_2O$, $O_3$, or the oxygen plasma can be used as the oxidizing material and TDMAH ($Hf[N(CH_3)_2]_4$) or TEMAZ ($Hf[N(C_2H_5)CH_3]_4$) as the organometallic material. For deposition of zirconium oxide, $H_2O$ can be used as the oxidizing material and TEMAZ ($Zr[N(C_2H_5)CH_3]_b$) or $ZrCl_4$ as the organometallic material. For deposition of gallium oxide, $H_2O$ or $O_3$ can be used as the oxidizing material and Ga(acac)$_3$ as the organometallic material. For deposition of magnesium oxide, $H_2O$, $O_3$, or $H_2O_2$ can be used as the oxidizing material and MgCp$_2$ or Mg(thd)$_2$ as the organometallic material. For deposition of titanium oxide, $H_2O$ can be used as the oxidizing material and TDMAT ($Ti[N(CH_3)_2]_4$) as the organometallic material. For deposition of tantalum oxide, $H_2O$ can be used as the oxidizing material and PET ($Ta(OC_2O_5)_5$) or $TaCl_5$ as the organometallic material. For deposition of zinc oxide, $H_2O$ can be used as the oxidizing material and DEZ ($Zn(C_2H_5)_2$), DMZ ($ZnMe_2$), or $ZnCl_2$ as the organometallic material.

FIG. 9A and FIG. 9B are timing charts showing other examples of timings of supply and evacuation of materials in Example 1. As shown in FIG. 9A, the period T2 for evacuation of the oxidizing material may be defined as a period of time enough to sufficiently evacuate the oxidizing material and, the period T4 for evacuation of the organometallic material as a period of time enough to supply the oxidizing material in the middle of the evacuation of the organometallic material. As shown in FIG. 9B, the period T2 for evacuation of the oxidizing material may be defined as a period of time enough to supply the organometallic material in the middle of the evacuation of the oxidizing material, and the period T4 for evacuation of the organometallic material may be defined as a period of time enough to supply the oxidizing material in the middle of the evacuation of the organometallic material.

According to Example 1, the first source material (e.g., either one of the organometallic material and the oxidizing material) is supplied into the chamber 20 (during the period T1 in FIG. 2). After stopping the supply of the first source material, the second source material the other of the organometallic material and the oxidizing material) is supplied into the chamber 20 (during the period T3 in FIG. 2), in the period in which the first source material remains in the atmosphere in the chamber 20 (the first period). By repeating the supply of the first source material and the supply of the second source material in this manner, the insulator containing both of an element in the first source material and an element in the second source material grows on the substrate 10. In this method, the second source material is supplied into the main chamber 20 while the first source material remains in the main chamber 20. Therefore, the first source material and the second source material react in the main chamber 20 to deposit a reaction product on the substrate 10.

This method can increase the deposition rate of the insulator. Furthermore, deposition of monoatomic layers on a layer-by-layer basis is also implemented in the same manner as in Comparative Example 1. Therefore, it is feasible to suppress the degradation of film quality of the insulator. A layer having a single composition can be deposited as the insulator.

The period in which the supply of both of the first source material and the second source material is stopped (the period T2 in FIG. 2) may be provided between a stop of supply of the first source material and a start of supply of the second source material, in the period in which the first source material remains in the atmosphere in the chamber 20.

Furthermore, as shown in FIG. 6, the period T2 in which the supply of both of the first source material and the second source material is stopped may be not more than two seconds.

Furthermore, as shown in FIG. 9B, the first source material may be supplied into the chamber 20 (during the period T1 in FIG. 9B), in the period in which the second source material remains in the atmosphere in the chamber 20 the period T4 in FIG. 9B, the third period), after the supply of the second source material into the chamber 20 (the period T3 in FIG. 9B).

Furthermore, the method may be arranged as follows: after the supply of the second source material into the chamber 20 (during the period T3 in FIG. 2), the supply of the second source material is stopped (during the period T4 in FIG. 2) and the second source material is evacuated from the inside of the chamber 20; thereafter, the first source material is supplied (during the period T1 in FIG. 2).

When an aluminum oxide film is deposited as the insulating film 14, the aluminum oxide film may be formed with the refractive index of not less than 1.55 and not more than 1.63. In this manner, the insulating film 14 can be intentionally deposited as one in a composition slightly deviating from the stoichiometric composition.

As shown in FIG. 2 and FIG. 9A, the method may be arranged so that in the middle of evacuation of at least one of the organometallic material and the oxidizing material, the other of the organometallic material and the oxidizing material is supplied. As shown in FIG. 9B, the method may be arranged so that the oxidizing material is supplied in the middle of the evacuation of the organometallic material and the organometallic material is supplied in the middle of the evacuation of the oxidizing material.

The timing for supplying the other of the organometallic material and the oxidizing material is a point of time before evacuation to the background. For example, as shown in FIG. 5, the pressure on the substrate 10 at a start of supplying the other of the organometallic material and the oxidizing material may be not less than 0.3 Torr. Namely, the pressure in the chamber 20 at a start of supply of the second source material may be not less than 0.3 Torr. This allows the organometallic material and the oxidizing material to react in the main chamber 20, thereby achieving improvement in the deposition rate. That is, achieving improvement in the deposition rate of the insulator in deposition of the insulator. This pressure is one enough to induce the reaction between the organometallic material and the oxidizing material, which may be not less than 0.5 Torr and not less than 1.0 Torr. This pressure may be three or more times and ten or more times the background pressure.

As shown in FIG. 4, the duration for the pressure in the main chamber 20 to drop to the background is about two seconds. Therefore, the evacuation period for either one of the organometallic material and the oxidizing material may be not more than two seconds. The evacuation period may be not more than 1.5 seconds.

As shown in FIG. 6, the deposition rate of the insulating film 14 may be not less than 0.12 nm/cycle and not less than 0.13 nm/cycle.

In the aluminum oxide film deposited with the use of TMA as the organometallic material and $O_3$ as the oxidizing material, the carbon concentration is not less than $1 \times 10^{21}$ $cm^{-3}$ and the hydrogen concentration is not less than $5 \times 10^{20}$ $cm^{-3}$. In the aluminum oxide film deposited with the use of TMA as the organometallic material and $H_2O$ as the oxidizing material, the carbon concentration is not less than $1 \times 10^{21}$ $cm^{-3}$ and the hydrogen concentration is not less than $5 \times 10^{19}$ $cm^{-3}$. In the aluminum oxide film deposited with the use of TMA as the organometallic material and the $O_2$ plasma as the oxidizing material, the carbon concentration is not less than $1 \times 10^{20}$ $cm^{-3}$ and the hydrogen concentration is not less than $5 \times 10^{20}$ $cm^{-3}$.

The temperature of the substrate 10 during the deposition of the insulating film 14 may be not less than 200° C. and not more than 400° C. Furthermore, the plasma source 22 may or may not be used. A thermal treatment may be carried out after formation of the insulating film 14 or insulator. The thermal treatment is executed, for example, at a treatment temperature in the range of 400° C. to 900° C. and in a thermal treatment duration in the range of one minute to 60 minutes.

The substrate 10 may be an insulating substrate or a semiconductor substrate. For example, the substrate to be used can be selected from a silicon substrate, a sapphire substrate, a SiC substrate, a GaAs substrate, and so on. The semiconductor layer 12 is, for example, a silicon layer or a III-V compound semiconductor layer. Without the semiconductor layer 12, the insulating film 14 can also be deposited directly on the substrate 10.

What is claimed is:

1. A vapor phase growth method comprising:
   a step of introducing a substrate into a chamber;
   a first step of adsorbing only a first element to the substrate by supplying an organometallic material as a first source material into the chamber, wherein, the first step, the chamber has a pressure above a background pressure;
   after the first step, a second step of suspending supply of the first source material into the chamber;
   after the second step, a third step of adsorbing a second element to the substrate by supplying an oxidizing material as a second source material into the chamber, wherein the supply of the second source material is started while the first source material remains in an atmosphere of the chamber and before the pressure in the chamber reaches the background pressure;
   after the third step, a fourth step of suspending supply of the second source material into the chamber; and
   a fifth step of repeating from the first step to the fourth step as an atomic layer deposition (ALD) process,
   wherein a duration of the fourth step is longer than that of the second step, and
   wherein the oxidizing material is oxygen or ozone.

2. The vapor phase growth method according to claim 1, wherein the duration of the second step is not more than two seconds.

3. The vapor phase growth method according to claim 2, wherein the duration of the second step is not more than 1.5 seconds.

4. The vapor phase growth method according to claim 3, wherein the duration of the second step is not more than one second.

5. The vapor phase growth method according to claim 1, wherein supply of the first source material into the chamber in the fifth step is started while the second source material remains in an atmosphere of the chamber.

6. The vapor phase growth method according to claim 1, wherein the organometallic material is trimethylaluminum or triethylaluminum.

7. The vapor phase growth method according to claim 1, wherein a film deposited on the substrate is a layer having a single composition in the thickness direction thereof.

8. The vapor phase growth method according to claim 1, wherein a pressure in the chamber at a start of the third step is not less than 0.3 Torr.

9. The vapor phase growth method according to claim 1, wherein a deposition rate of a film on the substrate is not less than 0.12 nm/cycle.

10. The vapor phase growth method according to claim 1, wherein a film formed on the substrate is aluminum oxide having a refractive index between 1.55 to 1.63.

11. A vapor phase growth method comprising:
a step of introducing a substrate into a chamber;
a first step of adsorbing only a first element to the substrate by supplying an organometallic material as a first source material into the chamber, wherein, in the first step, the chamber has a pressure above a background pressure;
after the first step, a second step of suspending supply of the first source material into the chamber;
after the second step, a third step of adsorbing a second element to the substrate by supplying an oxidizing material as a second source material into the chamber, wherein the supply of the second source material is started while the first source material remains in an atmosphere of the chamber and before the pressure in the chamber reaches the background pressure;
after the third step, a fourth step of suspending supply of the second source material into the chamber; and
a fifth step of repeating from the first step to the fourth step as an atomic layer deposition (ALD) process,
wherein the organometallic material is trimethylaluminum and the oxidizing material is oxygen or ozone,
wherein a film formed from the first element and the second element is an aluminum oxide film, the film being deposited on the substrate, and
wherein the film includes at least one of carbon whose concentration in the film is not less than $1 \times 10^{21}$ cm$^{-3}$ and hydrogen whose concentration in the film is not less than $5 \times 10^{20}$ cm$^{-3}$.

12. The vapor phase growth method according to claim 11, wherein the film is a layer having a single composition in the thickness direction thereof.

13. The vapor phase growth method according to claim 11, wherein a pressure in the chamber at a start of the third step is not less than 0.3 Torr.

14. The vapor phase growth method according to claim 11, wherein a deposition rate of the film is not less than 0.12 nm/cycle.

15. The vapor phase growth method according to claim 11, wherein a duration of the fourth step is longer than that of the second step.

* * * * *